United States Patent [19]

Boisson

[11] Patent Number: 4,893,123
[45] Date of Patent: Jan. 9, 1990

[54] TRANSMISSION SYSTEM HAVING A DIFFERENTIAL PULSE CODE MODULATION ENCODING APPARATUS AND AN ASSOCIATED DECODING APPARATUS

[75] Inventor: Jean-Yves Boisson, Clamart, France
[73] Assignee: U.S. Philips Corporation, New York, N.Y.
[21] Appl. No.: 50,181
[22] Filed: May 13, 1987
[30] Foreign Application Priority Data

May 23, 1986 [FR] France .................................. 86 07392

[51] Int. Cl.[4] .............................................. H03M 3/04
[52] U.S. Cl. ...................................... 341/143; 375/27; 358/135
[58] Field of Search ............... 341/143, 141, 142, 157, 341/155, 76, 64, 65; 358/105, 133, 135, 136, 138; 382/56; 375/27, 25, 26, 28

[56] References Cited

U.S. PATENT DOCUMENTS 4,369,464  1/1983  Temime ............................... 358/136
4,661,849  4/1987  Hinman ............................... 358/136

Primary Examiner—William M. Shoop, Jr.
Assistant Examiner—Brian K. Young
Attorney, Agent, or Firm—Edward W. Goodman

[57] ABSTRACT

A transmission system for use in digital television has an input for receiving a signal to be encoded, a difference circuit (12) for supplying a differential signal formed by a given number of binary elements representing the difference between the signal to be encoded and a prediction signal, a transmission prediction circuit for supplying the prediction signal, a transmission transcoding circuit (15) for reducing the number of binary elements of the differential signal as a function of a control information, an activity measuring circuit (30) for supplying an activity information, a statistic encoding circuit (22) for variable word length coding of the output signal of the transcoding circuit, a buffer memory circuit (25) for storing the words of the statistic encoding circuit and for supplying them to the output of the system, and an occupation measuring circuit (45) for supplying an occupation information of the buffer memory circuit. This system furthermore includes a combination circuit (50) for supplying the control information in response to the activity information and the occupation information applied thereto.

6 Claims, 5 Drawing Sheets

TRANSMISSION SYSTEM HAVING A DIFFERENTIAL PULSE CODE MODULATION ENCODING APPARATUS AND AN ASSOCIATED DECODING APPARATUS

BACKGROUND OF THE INVENTION

The invention relates to a differential pulse code modulation encoding apparatus comprising an input for receiving the signal to be encoded, a difference circuit for supplying a differential signal formed by a given number of binary elements representing the difference between the signal to be encoded and a prediction signal, a transmission prediction circuit for supplying this prediction signal, a transmission transcoding circuit for reducing the number of binary elements of the differential signal as a function of a control information, an activity measuring circuit for supplying an activity information, a statistic encoding circuit for variable word length coding of the output signal of the transcoding circuit, a buffer memory circuit for storing the output words of the statistic encoding circuit and for supplying them to the output of the apparatus and an occupation measuring circuit for supplying an occupation information of the buffer memory circuit.

An encoding apparatus of this kind is used on a large scale especially in the field of digital television. In this connection, reference may be made to the article by Peter Pirsch entitled "Design of DPCM Quantizers for Video Signals Using Subjective Tests" published in July, 1981, in the magazine "IEEE Transactions on Communications", Vol. Com. 29, No. 7.

It is known that in an apparatus of this kind, the problem is met of overflow of the memory circuit due to the statistic encoding circuit. In fact, it may happen that the encoding of a picture implies the use of words of great length so that the number of data entering the memory circuit is larger than that leaving it.

It is known in order to solve a problem of this kind to operate at the level of the transcoding circuit in such a sense that the statistic encoding circuit supplies words of smaller length (see, for example, the article by Toshio et al entitled: "Statistical Performance Analysis of an Interframe Encoder for Broadcast Television Signals" published in December, 1981, in the magazine "IEEE Transactions on Communications", Vol. Com. 29, No. 12).

However, with this kind of measurements, the picture is then encoded in too rough a form and the quality of the latter becomes poor.

SUMMARY OF THE INVENTION

The present invention suggests an encoding apparatus of the kind mentioned in the opening paragraph, which permits guaranteeing a picture of sufficient quality in a larger number of cases in which a risk of overflow is detected.

To this end, this apparatus is characterized in that it furthermore comprises a combination member for supplying control information in response to the activity information and the occupation information applied thereto.

The invention also relates to an associated decoding apparatus and to a transmission system comprising at least one such an encoding apparatus or decoding apparatus.

BRIEF DESCRIPTION OF THE DRAWINGS

In order that the invention may be readily carried out, it will now be described more fully, by way of example, with reference to the accompanying drawings, in which.

DETAILED DESCRIPTION OF THE INVENTION

Figure 1:
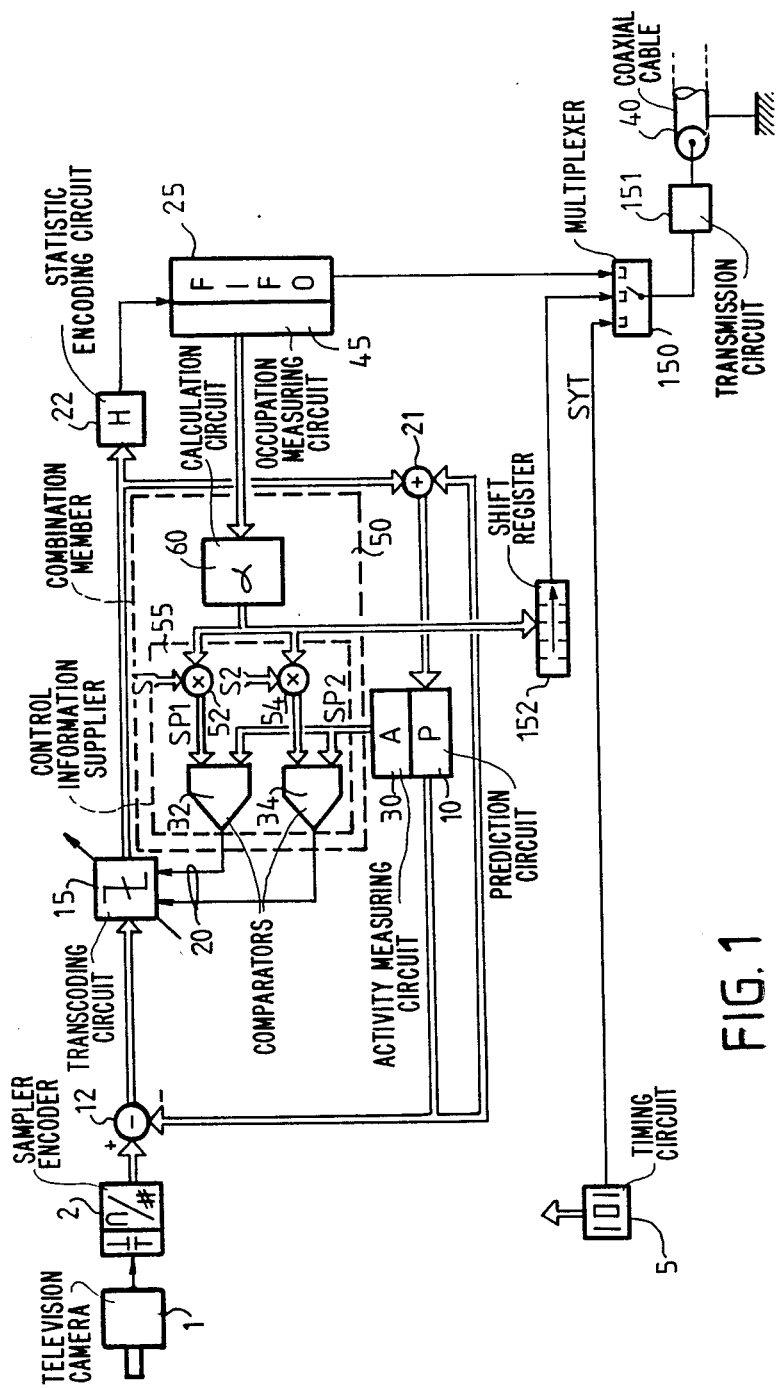
FIG. 1 shows an encoding apparatus according to the invention.

In FIG. 1, reference numeral 1 indicates a television camera; the analog signal at its output is encoded in digital form by a sampler encoder 2 in the rhythm defined by a timing circuit 5.

Figure 2:
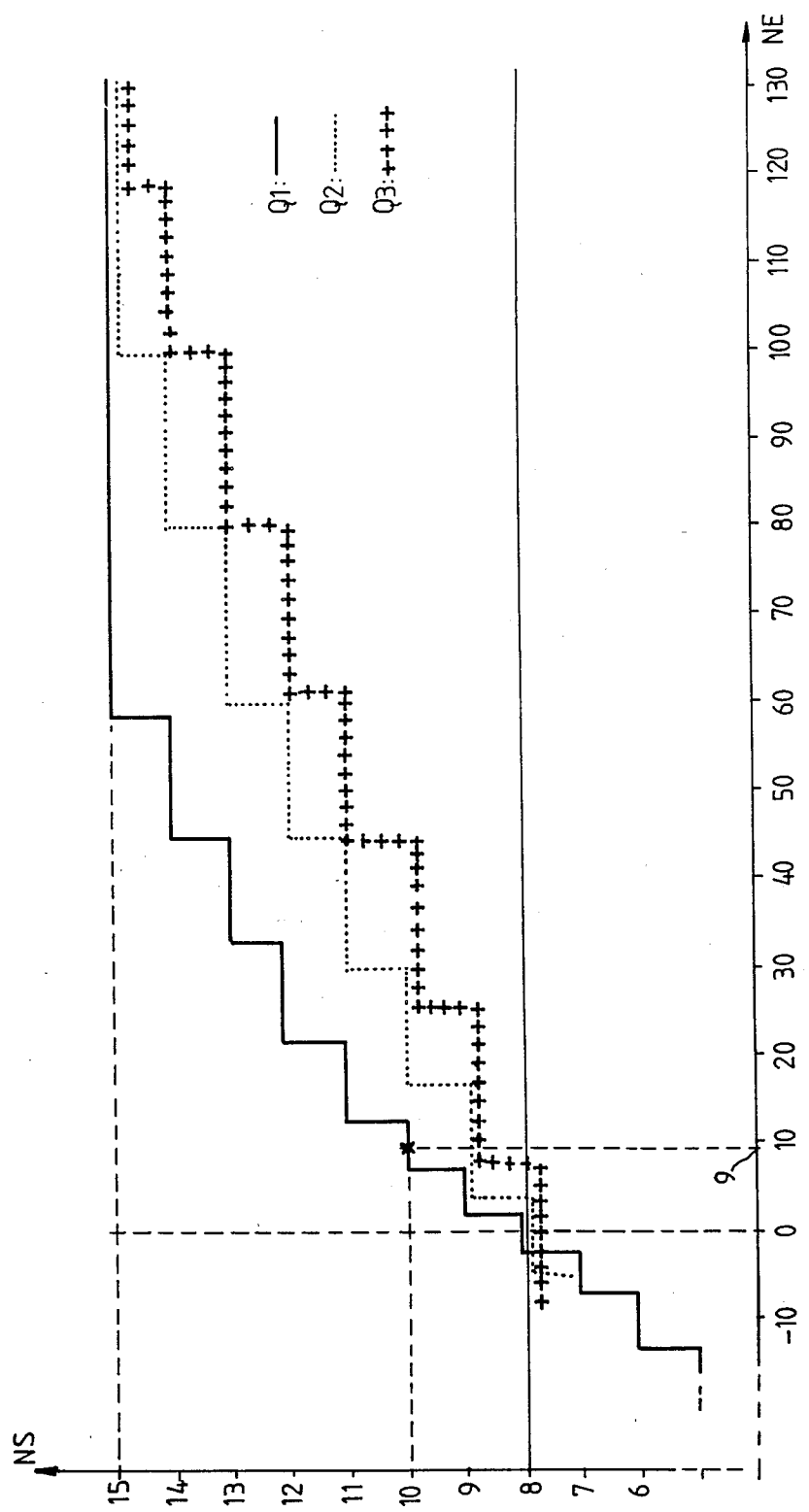
FIG. 2 shows the form of transcoding characteristics.

The sample at the output of the sampler encoder 2 is compared with the sample supplied by a prediction circuit 10. For this comparison use is made of a difference circuit 12. The resulting differential signal is applied to the input of a transcoding circuit 15, which reduces the number of binary elements in the differential signal. This reduction is effected according to characteristics $Q_1$, $Q_2$ and $Q_3$, whose form is shown, in part in FIG. 2. Thus, in the example concerned, the differential signal is encoded according to NE at 511 levels ($-255$ to $+255$) at the input, while the signal at the output presents not more than 15 of these levels according to NS; the choice of these different characteristics $Q_1$, $Q_2$ and $Q_3$ is determined by a control information applied to an input 20. The output code of the transcoding circuit 15 is applied, on the one hand to the input of an adder 21 which also receives at its other input, the signal of predictor 10 and, on the other hand, to the input of a statistic encoding circuit 22 causing digital words of small length to correspond to the input words arriving most frequently, that is to say, the words representing differential signals of low value. Thus, for NS=8, there will be obtained a word of one binary element, for NS=9 or 7, a word of three binary elements, and for NS=10 or 6, a word of five binary elements, and so on, ... according to the encoding strategy proposed by Huffman. For this purpose, section 6.2.3.2 of the book entitled "Digital Image Processing" by R. C. Gonzalez and P. Wintz, edited in 1977 by Addison-Wesley Publishing Company can be consulted.

The code supplied by this statistic encoding circuit 22 is presented in serial form at its output and is applied to a buffer memory circuit 25 constituted essentially by a memory of the type "first data input, first data output", known more generally under the designation "Fifo memory".

For determining the transcoding characteristics $Q_1$, $Q_2$ and $Q_3$ of the transcoding circuit 15, use is made of an activity measuring circuit 30 cooperating with the prediction circuit 10. The activity values processed by this circuit are compared with threshold values $SP_1$ and $SP_2$ by means of comparators 32 and 34.

It is known that the activity defines a luminance transition between picture elements; the activity is stronger as the transition is more abrupt. A rough characteristic, for example $Q_3$, is associated with a strong activity, because it is not necessary (see the first article mentioned above) to encode with accuracy the levels situated on either side of the transition. Consequently, a fine characteristic, $Q_2$ or even better $Q_1$, is associated with a low activity. Thus, by the choice of these characteristics, it is attempted to reach the levels NS near 8 corresponding to words of small length processed by the Huffman encoder 22. However, favorable cases may arise in which the words are very long and/or the transmission rate authorized by the transmission channel (shown in FIG. 1 by a coaxial cable 40) is insufficient. It results therefrom that the memory circuit 25 is liable to overflow, this risk being signalled by an occupation information produced by means of an occupation measuring circuit 45 connected to the buffer memory circuit 25.

In order to avoid this overflow, the encoding apparatus moreover comprises, according to the invention, a combination member 50 for supplying the control information in response to the activity information and the occupation information applied thereto.

This combination member 50 is constituted by comparators 32 and 34 and two multipliers 52 and 54 for multiplying by a factor $\alpha$ two pre-established threshold values $S_1$ and $S_2$ and for supplying:

$$SP_1 = \alpha \cdot S_1$$

$$SP_2 = \alpha \cdot S_2.$$

The elements 32, 34, 52 and 54 form part of a common assembly 55, which will be present also in the decoding apparatus associated with this encoding apparatus. This factor $\alpha$ is established by means of a calculation circuit 60 which carries out the following operation:

$$\alpha(T+1) = \alpha(T) - K \cdot \{\rho B(T) + [B(T) - B(T-1)]\}$$

where $$K = [\alpha(T) - \alpha(T-1)]/[B(T) - 2B(T-1) + B(t-2)]$$

and $\rho$ is a damping coefficient, whose value can be equal to 0.5.

It should therefore be noted that the coefficients $\alpha$ are calculated for successive time periods $\tau$ and instants i. $\tau$, where $i = -\infty, \ldots, T-2, T-1, T$, the instant T. $\tau$ corresponding to the present instant. The duration $\tau$ in practice corresponds to the duration of a picture frame. B(T) is designated as the degree of filling of the memory circuit 25 comprising a number of binary elements and considered at the instant T; B(T−1) designates the degree of filling at the instant T−1 and B(T−2), at the instant T−2. Consequently, it is proposed to determine $\alpha(T+1)$, which brings the degree of filling B(T+1) to zero, or rather, reduces it by the damping coefficient $\rho$ so as to bring it back to a fraction of the preceding degree of filling, i.e. $B(T+1) = (1-\rho)B(T)$.

In order to calculate $\alpha(T+1)$, it is admitted that the variations of the degree of filling are a linear function of $\alpha$, which permits of writing in the present case, with a constant $\alpha_0$ to be eliminated:

$$(T) = k[B(T) - B(T-1)] + \alpha_0.$$

In order to estimate $\alpha(T+1)$, it is therefore required that:

$$B(T+1) - B(T) = -\rho B(T)$$

and hence $$\alpha(T+1) = \alpha(T) - k \cdot [B(T) - B(T-1)] + k \cdot [-\rho B(T)]$$

and therefore the formula proposed.

The calculation circuit 60 establishes the evaluation of $\alpha(T+1)$ only with regard to reading of the degree of filling of the memory circuit 25; this degree of filling constitutes in the example described the occupation information.

Figure 3:
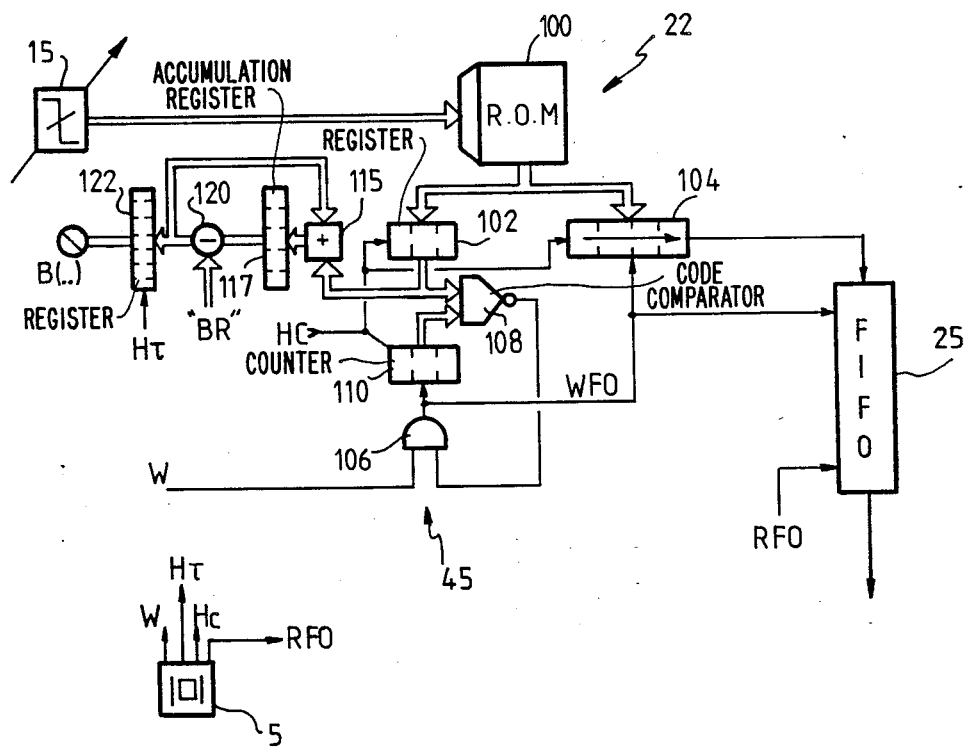
FIG. 3 illustrates how the statistic encoding circuit, the memory circuit and the occupation measuring circuit forming part of the apparatus of FIG. 1 are realized.

In FIG. 3, in which the statistic encoding circuit 22 cooperating with the occupation measuring circuit 45 is shown in greater detail, there is illustrated how the occupation information is processed.

The encoder 22 is constituted essentially by a read-only memory 100, which is addressed by the output code of the transcoding circuit 15. The code at the output of read-only memory 100 is split into two parts; one part is applied to the parallel inputs of a register 102 and the other part is applied to the parallel inputs of a shift register 104; the register 102 is intended to contain a value indicating the width of the word in the register 104. The shift control means for loading these registers 102 and 104 receive a signal HC, which is active in the same rhythm in which the sampling is effected by the sampler encoder 2. The series output of the shift register 104 is connected to the input of the memory circuit 25. The memory circuit 25 is written the by means of a signal WFO in the same rhythm as the shifts of the shift register 104. This signal WFO originates from the output of an AND gate 106 having two inputs: the first input receives periodical signals W, whose rhythm is a multiple of the frequency of the signals HC, this multiple corresponding to the maximum length of the codes contained in the register 104. The second input of the gate 106 is connected to the output of a code comparator 108, which supplies a blocking signal for the gate 106 when an equality of codes contained, on the one hand, in the register 102 and, on the other hand, in a counter 110 counting the pulses of the signal WFO is detected. This counter 110 is reset to zero as soon as the signal HC is active.

Thus, the memory circuit 25 is filled successively with the binary elements constituting each word of variable length. In order to obtain the degree of filling of the memory circuit 25, use is made of an accumulator circuit formed by an adder 115 and an accumulation register 117. The adder 115 supplies the sum of the content of the register 102 and the content of the register 117 minus a value "BR". This reduction is obtained by means of a subtraction circuit 120. The value "BR" defines the optimum degree of filling of the memory circuit 25, for example, half one of its capacity. A signal H $\tau$, which becomes active after each period of time $\tau$, permits loading into a register 122 the effective degree of filling B ( . . . ) for the calculation circuit 60. It should be noted that the memory circuit 25 is emptied in the rhythm of a reading signal RFO. In order that the information thus coded can be transmitted, use is made of a multiplexer 150 (cf. FIG. 1); this multiplexer 150 transmits, via a line transmission circuit 151 to the transmission channel 40 during a first period a synchronization code "SYT" supplied by the timing circuit, 5, and then during a second period, the value α originating from a shift register 152, whose parallel inputs are connected to the output of the circuit 60, and finally during a third period, the picture informations originating from the memory circuit 25, and this is reproduced by each picture frame. The different signals W, H τ, HC and RFO, which have been mentioned, originate from the timing circuit 5.

Figure 4:
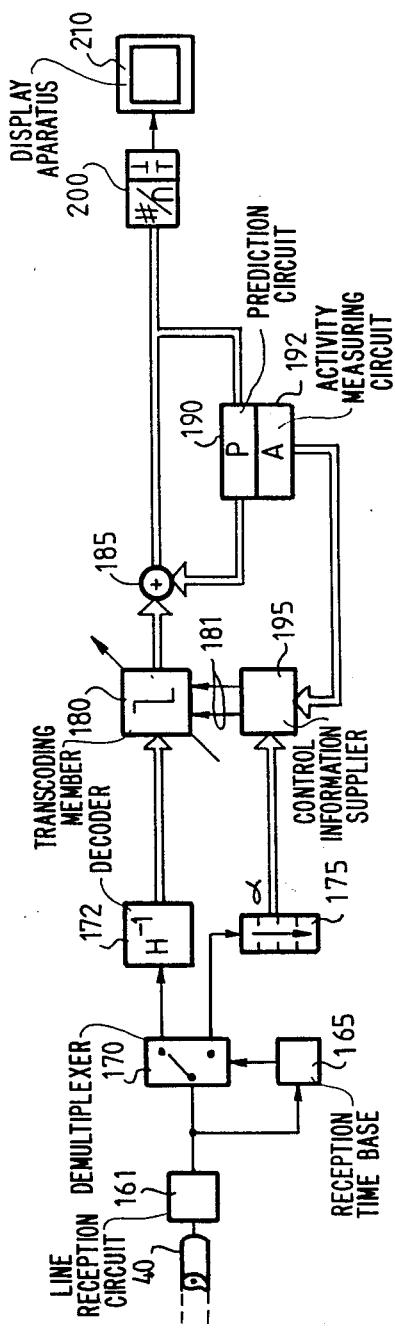
FIG. 4 shows a decoding apparatus according to the invention.

The decoding apparatus according to the invention is shown in FIG. 4 and is composed of a line reception circuit 161, whose input is connected to the transmission channel 40 and whose output is connected, on the one hand, to the input of a reception time base 165 and, on the other hand, to a demultiplexer 170, which is controlled by the reception time base 165 and which permits supplying, on the one hand, the value α to a register 175 and, on the other hand, the words of variable length to a decoder 172 carrying out an operation inverse to the statistic encoding circuit 22. A transcoding member 180 carries out an operation inverse to that carried out by the transcoding circuit 15, i.e. one of the inverse characteristics $Q_1^{-1}$, $Q_2^{-1}$, $Q_3^{-1}$. The value to be chosen will be taken in the middle of each step. Thus a code NS=10 will correspond to a code NE=9 for the characteristic $Q_1^{-1}$, the choice of one of these characteristics being defined by a code information applied to its inputs 181. An adder circuit 185 supplies the sum of the output code of the transcoding member 180 and the output code at the output of a prediction circuit 190 having the same structure as the prediction circuit 10; an activity measuring circuit 192 is also present having the same structure as the activity measuring circuit 30; the indication of the measurement is combined with the information α by the circuit 195 to supply the control information in the same manner as the assembly 55. A digital-to-analog converter 200 permits supplying the suitable informations in order that a display apparatus 210 can operate.

Figure 5:
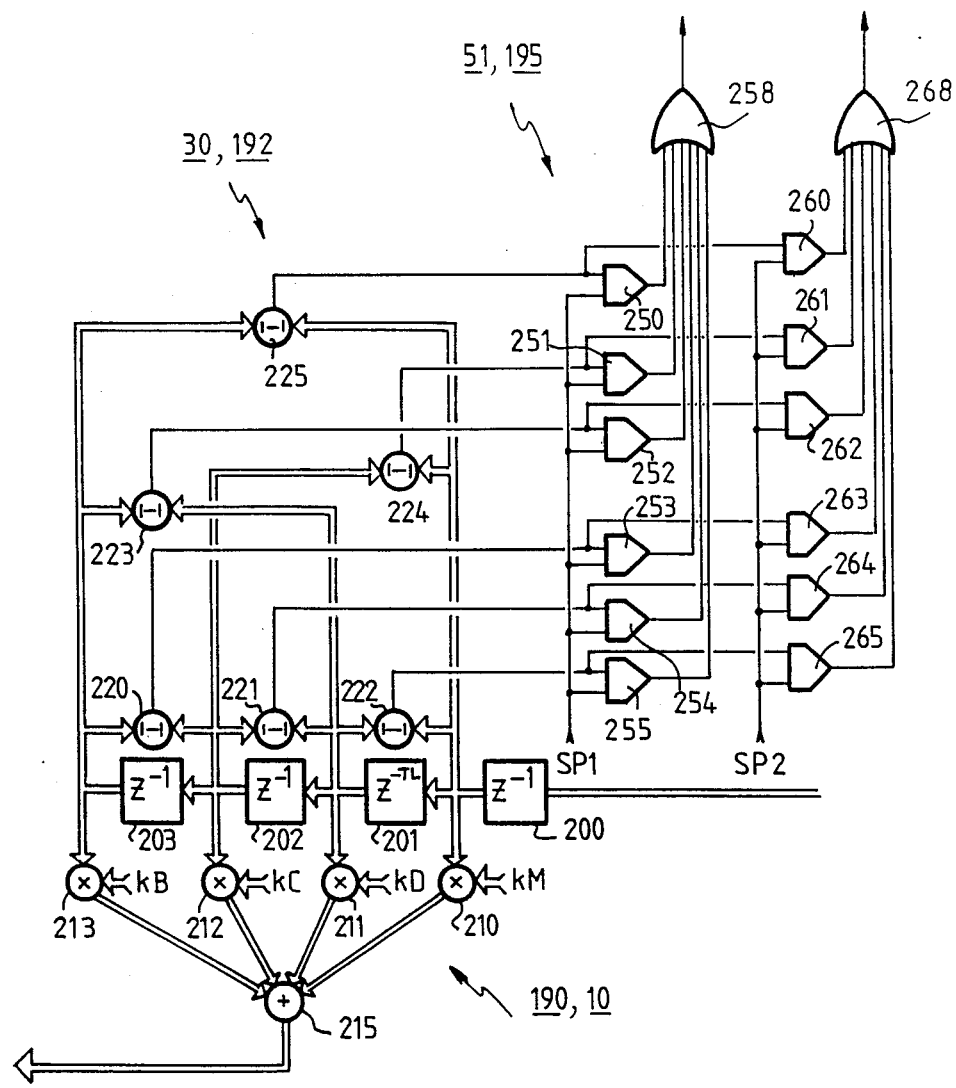
FIG. 5 illustrates how the prediction circuit, the activity measuring circuit and the combination member can be realized.

FIG. 5 indicates a possible example of the method of realizing the prediction circuit with the activity measuring circuit, and the method of obtaining the control information. These circuits utilize the luminance of the points on the preceding line and of the preceding points of the same line.

The assembly shown in FIG. 5 is built around an assembly of delay elements 200, 201, 202 and 203 connected in cascade, the elements 200, 202 and 203 producing a delay of a picture element, while the element 201 producing a delay equivalent to a picture line minus two picture elements. From the different signals at the outputs of these delay elements, on the one hand, the prediction can be carried out and, on the other hand, the activity can be measured.

With regard to the prediction, multiplexers 210, 211, 212 and 213 form the respective products of the prediction coefficients KM, KD, KC and KB of the signals at the outputs of the elements 200, 201, 202 and 203; an adder 215 supplies the prediction value by forming the sum of the above products.

With regard to the activity, use is made of difference operators 220, 221, 222, 223, 224 and 225, which give the absolute value of the difference of the signals applied to their inputs. These inputs are connected to each of the outputs of the elements 200 to 203. A first series of comparators 250 to 255 detects if one of the results produced by one of the operators 220 to 225 exceeds the threshold value SP1; an OR gate 228 receives all the results of this series of comparators 250 to 255 so as to restitute the first binary element of the control information. A second series of comparators 260 to 265 detects if one of the results produced by one of the operators 220 to 225 exceeds the threshold value SP2; an OR gate 238 receives all the results of this second series of comparators 260 to 265 so as to constitute the second binary element of the control information.

The transcoders 180 and 15 are constituted advantageously by a read-only memory whose addresses are constituted, on the one hand, for the small weights by the output signal of the subtraction circuit 12 or the decoder 172 and, on the other hand, for the large weights by the control information.

Figure 6:
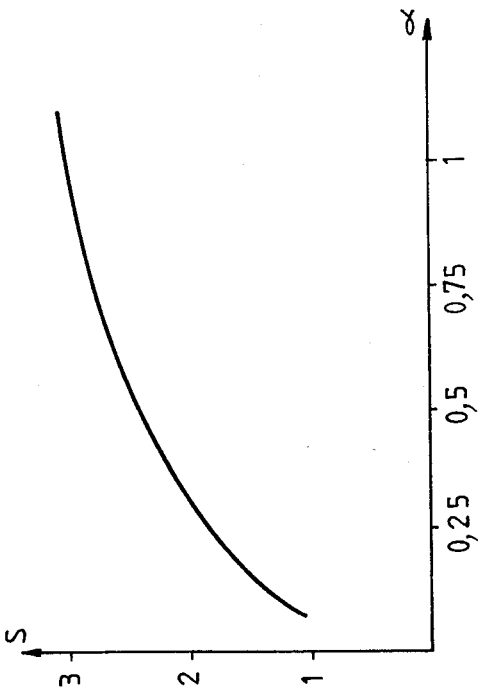

FIG. 6 illustrates how the factor α acts upon the entropy S which defines the lower limit of the encoding in bits per picture element. This consequently gives the regulation of the possible rate.

I claim:

1. A differential pulse code modulation encoding apparatus comprising:
   an input for receiving an input signal to be encoded;
   a difference circuit coupled to said input for forming a differential signal, having a number of binary elements, from the difference between said input signal and a prediction signal;
   a transmission prediction circuit for forming said prediction signal, said transmission prediction circuit being coupled to an input of said difference circuit;
   a transmission transcoding circuit coupled to an output of said difference circuit for reducing said number of binary elements in said differential signal as a function of a control information;
   a statistic encoding circuit coupled to an output of said transmission transcoding circuit for variable word length coding of an output signal of said transmission transcoding circuit;
   a buffer memory circuit coupled to an output of said statistic encoding circuit for storing encoded output words from said statistic encoding circuit and for supplying said stored encoded output words to an output of said apparatus;
   an activity measuring circuit coupled to said transmission prediction circuit and to said output of said transmission transcoding circuit for generating an activity information; and
   an occupation measuring circuit coupled to said buffer memory circuit for generating an occupation information of said buffer memory circuit, characterized in that said encoding apparatus further comprises:
   a combining circuit coupled to an output of said activity measuring circuit and an output of said occupation measuring circuit for supplying said control information to a control input of said transmission transcoding circuit in response to said activity information and said occupation information.

2. A differential pulse code modulation encoding apparatus as claimed in claim 1, in which the transcoding circuit has several transcoding characteristics which are pre-established and are predetermined by the control information, characterized in that the combining circuit comprises comparison means for comparing the activity information with threshold informations in order to form said control information, and combination circuits for forming the threshold informations in response to the occupation information and pre-established threshold information applied thereto.

3. A differential pulse code modulation encoding apparatus as claimed in claim 2, in which the occupation information is in the form B(T) corresponding to the degree of filling of the buffer memory circuit, characterized in that the combining circuit further comprises a calculation circuit for forming factors α at instants i.τ, with i=−∞, ..., T−2, T−1, T, where:

$$\alpha(T+1) = \alpha(T) - k \cdot (\rho B(T) + (B(T) - B(T-1)))$$

and where:

$$k = (\alpha(T) - \alpha(T-1))/(B(T) - 2B(T-1) + B(T-2))$$

wherein ρ is a damping coefficient and τ are successive time periods, and in that the combination circuits are multipliers for forming the products of the pre-established threshold information with the factors α.

4. A differential pulse code modulation encoding apparatus as claimed in claim 1, characterized in that said encoding apparatus further comprises means for applying a decoding information derived from said occupation information to said output of said apparatus along with said stored encoded output words.

5. A pulse code modulation decoding apparatus for decoding encoded output words generated by an encoding apparatus as claimed in claim 4, characterized in that said decoding apparatus comprises:
  an input for receiving said encoded output words and said decoding information;
  an extraction circuit coupled to said input for separating said decoding information from said encoded output words;
  a decoder coupled to an output of said extraction circuit for variable word length decoding of said encoded output words, said decoder performing an operation inverse to that of said statistic encoding circuit;
  a reception transcoding circuit coupled to an output of said decoder for transcoding an output signal of said decoder as a function of a reception control information, said reception transcoding circuit performing an operation inverse to that of said transmission transcoding circuit;
  an adder coupled to an output of said reception transcoding circuit for adding an output signal of said reception transcoding circuit to a reception prediction signal, an output of said adder forming an output of said decoding apparatus;
  a reception prediction circuit coupled to said output of said adder for providing said reception prediction signal;
  a reception activity measuring circuit coupled to said reception prediction circuit for forming an activity information; and
  a combining circuit coupled to said reception activity measuring circuit and said separating circuit for forming said reception control information in response to said activity information and said decoding information derived from said occupation information, said combining circuit applying said reception control information to a control input of said reception transcoding circuit, wherein said reception prediction circuit, said reception activity measuring circuit, and said combining circuit are substantially similar to corresponding circuits in said encoding apparatus.

6. A differential pulse code modulation transmission system having an encoding apparatus and at least one decoding apparatus, characterized in that said encoding apparatus comprises:
  an input for receiving an input signal to be encoded;
  a difference circuit coupled to said input for forming a differential signal, having a number of binary elements, from the difference between said input signal and a prediction signal;
  a transmission prediction circuit for forming said prediction signal, said transmission prediction circuit being coupled to an input of said difference circuit;
  a transmission transcoding circuit coupled to an output of said difference circuit for reducing said number of binary elements in said differential signal as a function of a control information;
  a statistic encoding circuit coupled to an output of said transmission transcoding circuit for variable word length coding of an output signal of said transmission transcoding circuit;
  a buffer memory circuit coupled to an output of said statistic encoding circuit for storing encoded output words from said statistic encoding circuit and for supplying said stored encoded output words to an output of said apparatus;
  an activity measuring circuit coupled to said transmission prediction circuit and to said output of said transmission transcoding circuit for generating an activity information;
  an occupation measuring circuit coupled to said buffer memory circuit for generating an occupation information of said buffer memory circuit;
  a combining circuit coupled to an output of said activity measuring circuit and an output of said occupation measuring circuit for supplying said control information to a control input of said transmission transcoding circuit in response to said activity information and said occupation information; and
  means for applying a decoding information derived from said occupation information to said output of said apparatus
  along with said stored encoded output words; and said decoding apparatus comprises:
  an input for receiving said encoded output words and said decoding information;
  an extraction circuit coupled to said input for separating said decoding information from said encoded output words;
  a decoder coupled to an output of said extraction circuit for variable word length decoding of said encoded output words, said decoder performing an operation inverse to that of said statistic encoding circuit;
  a reception transcoding circuit coupled to an output of said decoder for transcoding an output signal of said decoder as a function of a reception control information, said reception transcoding circuit performing an operation inverse to that of said transmission transcoding circuit;
  an adder coupled to an output of said reception transcoding circuit for adding an output signal of said reception transcoding circuit to a reception prediction signal, an output of said adder forming an output of said decoding apparatus;

a reception prediction circuit coupled to said output of said adder for providing said reception prediction signal;

a reception activity measuring circuit coupled to said reception prediction circuit for forming an activity information; and a combining circuit coupled to said reception activity measuring circuit and said separating circuit for forming said reception control information in response to said activity information and said decoding information derived from said occupation information, said combining circuit applying said reception control information to a control input of said reception transcoding circuit, wherein said reception prediction circuit, said reception activity measuring circuit, and said combining circuit are substantially similar to corresponding circuits in said encoding apparatus.

* * * * *